United States Patent [19]

Kobayashi et al.

[11] Patent Number: 5,124,269
[45] Date of Patent: Jun. 23, 1992

[54] METHOD OF PRODUCING A SEMICONDUCTOR DEVICE USING A WIRE MASK HAVING A SPECIFIED DIAMETER

[75] Inventors: Kenji Kobayashi; Kazunori Tsuge; Yoshihisa Tawada, all of Kobe, Japan

[73] Assignee: Kanegafuchi Kagaku Kogyo Kabushiki, Osaka, Japan

[21] Appl. No.: 633,192

[22] Filed: Dec. 28, 1990

Related U.S. Application Data

[63] Continuation of Ser. No. 318,209, Mar. 3, 1989, abandoned.

[30] Foreign Application Priority Data

Mar. 5, 1988 [JP] Japan .................. 63-52075

[51] Int. Cl.$^5$ ............... H01L 21/00; H01L 21/02; H01L 21/92
[52] U.S. Cl. ............... 437/4; 437/2; 437/181; 136/244; 136/249; 136/256; 136/258
[58] Field of Search .......... 437/2, 4, 181, 184, 437/202, 203, 248, 937; 136/244, 249, 255, 256, 258, 259

[56] References Cited

U.S. PATENT DOCUMENTS

| | | | |
|---|---|---|---|
| 3,969,686 | 7/1976 | Scifres et al. | 357/16 |
| 4,297,391 | 10/1981 | Lindmayer | 437/2 |
| 4,476,563 | 10/1984 | Van Ruyven | 357/17 |
| 4,543,441 | 9/1985 | Kumada et al. | 357/30 K |
| 4,585,502 | 4/1986 | Uozu et al. | 156/668 |
| 4,707,394 | 11/1987 | Chant | 156/656 |
| 4,725,375 | 2/1988 | Fujii et al. | 156/659.1 |

FOREIGN PATENT DOCUMENTS 0170554 10/1982 Japan .
0025738 5/1983 Japan .

OTHER PUBLICATIONS

Ghandhi, S., VLSI Fabrication Principles, pp. 499, 525-526, Wiley & Sons, 1983.

*Primary Examiner*—Brian E. Hearn
*Assistant Examiner*—B. Everhart
*Attorney, Agent, or Firm*—Armstrong & Kubovcik

[57] ABSTRACT

A semiconductor device producing method wherein a patterned transparent electrode, a patterned amorphous silicon semiconductor layer and a patterned backside electrode are formed on a substrate sequentially in this order, and the patterning of at least one of the amorphous silicon semiconductor layer and the backside electrode is carried out in a step of forming at least one of the amorphous silicon semiconductor layer and the backside electrode with a wire mask being brought into substantially close contact with a surface subjected to film forming and a step of removing a thin film formed at a region between the wire mask and the surface subjected to film forming in the forming step; and a film forming apparatus used in the producing method comprising a holder which holds a substrate having a surface subjected to film forming, a mechanism for fixing and positioning the substrate on the holder and a plurality of wires which are disposed on the film forming surface side of the substrate and are to be brought into substantially close contact with the film forming surface. The method and the apparatus enable the film forming operation and the patterning operation to be carried out simultaneously without lowering the characteristics of a solar cell.

12 Claims, 2 Drawing Sheets

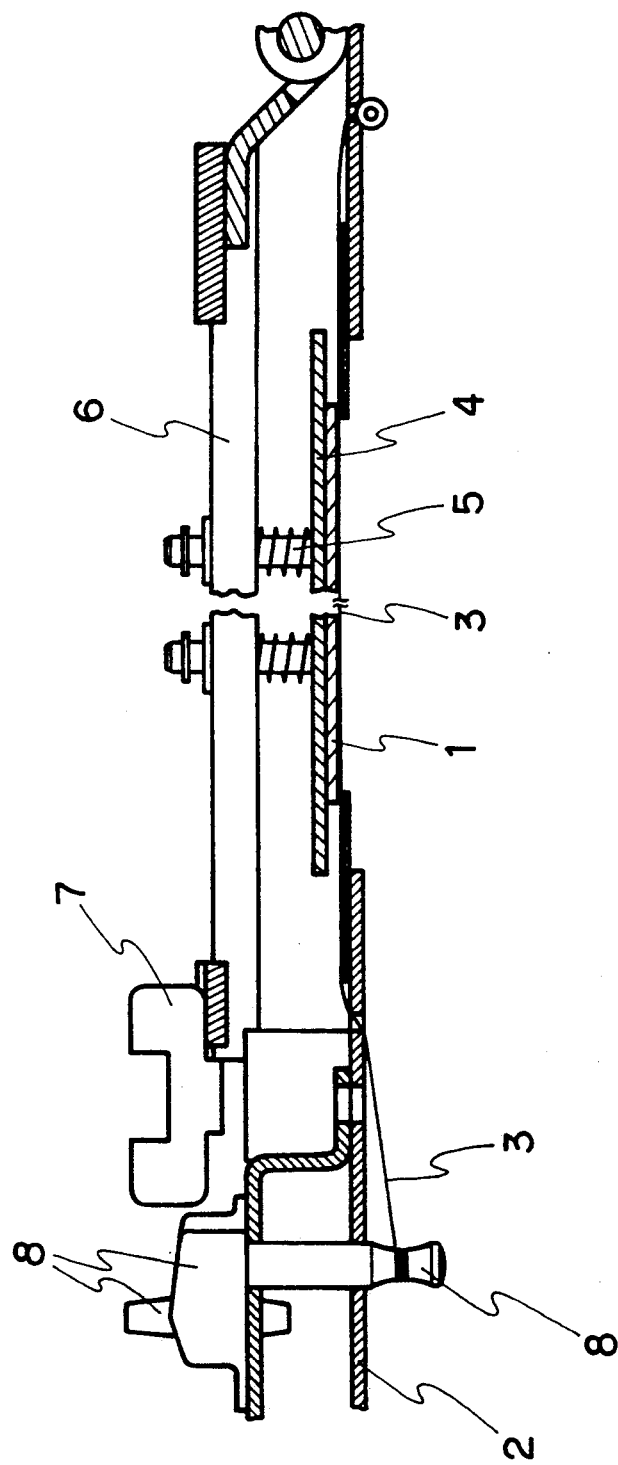

METHOD OF PRODUCING A SEMICONDUCTOR DEVICE USING A WIRE MASK HAVING A SPECIFIED DIAMETER

This application is a continuation of application Ser. No. 318,209 filed Mar. 3, 1989, now abandoned.

BACKGROUND OF THE INVENTION

The present invention relates to a producing method of a semiconductor device and a film forming apparatus used therefor, and more particularly to a semiconductor device producing method wherein a satisfactorily patterned semiconductor layer or backside electrode of an amorphous silicon solar cell can be formed by simple and easy steps, and a film forming apparatus used in forming a semiconductor layer or a backside electrode of an amorphous silicon solar cell wherein a fine threads are provided in close contact with a film forming surface of a substrate and therefore the patterning operation can be performed concurrently in the film forming operation, a separate patterning step can be eliminated and the producing cost can be reduced steeply.

Hitherto, for the purpose of the integration, the patterning of an amorphous silicon semiconductor layer or a backside electrode is conducted by utilizing high-energy beam such as laser beam.

However, in the patterning operation for an amorphous silicon semiconductor layer by utilizing laser beam, there are problems that the characteristics of a solar cell are lowered due to a damage to a transparent electrode, and that the contact resistance between the transparent electrode and the backside electrode changes with the passage of time (i.e. the resistance increases) at the laser-scribed portion.

In addition, the patterning of the backside electrode using laser beam is highly difficult and results in unstable production. Consequently a method such as the etching method or the lift-off method other than the laser patterning method is reluctantly employed, but in that case there is caused a different problem that the yield is lowered and the producing cost is increased due to the increase of the number of the processing steps and the lowering of the productivity.

Further in any of the above cases, patterning has to be performed after the formation of the amorphous silicon semiconductor layer or the backside electrode, and thus the number of processing steps increases and consequently the producing cost increases.

An object of the present invention is to provide a producing method of a semiconductor device and film forming apparatus used therefor, which enable the film forming operation and the patterning operation to be carried out simultaneously without lowering the characteristics of a semiconductor device.

SUMMARY OF THE INVENTION

A producing method of a semiconductor device of the present invention is a method wherein a patterned transparent electrode, a patterned amorphous silicon semiconductor layer and a patterned backside electrode are formed on a substrate sequentially in this order, characterized in that the patterning of at least one of the amorphous silicon semiconductor layer and the backside electrode is carried out in a step of forming at least one of the amorphous silicon semiconductor layer and the backside electrode with a wire mask being brought into substantially close contact with a surface subjected to film forming and a step of removing a thin film formed in the forming step at a region between the wire mask and the surface subjected to film forming.

A film forming apparatus of the present invention is an apparatus used in the above producing method of the present invention.

A film forming apparatus of the present invention is an apparatus which is used in forming a semiconductor layer or a backside electrode of an amorphous silicon semiconductor device, characterized by comprising a holder which holds a substrate having a surface subjected to film forming, a means for fixing and positioning the substrate on the holder and a plurality of wires which are disposed facing the film forming surface side of the substrate and are to be brought into substantially close contact with the film forming surface.

The above mentioned apparatus of the present invention is a film forming apparatus which enables the film forming operation and the patterning operation to be performed simultaneously without lowering the characteristics of a solar cell. As illustrated in FIG. 1 and FIG. 2, an embodiment of the film forming apparatus of the present invention is composed of a holder 2 which holds a substrate 1; wires 3 stretched over the region of the holder 2 for holding the substrate 1 in such a manner that the wires 3 are to be brought into substantially close contact with the film forming surface; a means for fixing the substrate comprising a backing plate 4, a spring 5, a pressing member 6 for the backing plate 4 and locking lever 7; a tension control screw 8 for adjusting the tension of each wire 3; and a guide 9 for positioning the substrate 1. Thus, the aforementioned film forming apparatus has a construction wherein fine wires are stretched in such a manner that the fine wires are brought into substantially close contact with the film forming surface of the substrate. Therefore, the film forming operation and the patterning operation can be carried out simultaneously, and there is no need of a separate patterning step which has been required in the prior art, accordingly the producing cost can be reduced steeply.

Thus, the aforementioned film forming apparatus can be successfully employed in the semiconductor device production in most cases. However, in the patterning operation using the film forming apparatus of the present invention especially in patterning an amorphous silicon semiconductor layer by means of the plasma-CVD method or in patterning a backside electrode by means of the sputtering method, there is a possibility of film formation at a region between a fine wire and a film forming surface (hereinafter referred to as "hinderside film formation"). Since the tension adjustment of the fine wires to prevent the hinderside film formation is not easy, there is a fear of insufficient isolation at the pattern line.

The semiconductor device producing method of the present invention includes a step of removing a thin film left behind the fine wires, and therefore, can eliminate the fear of insufficient isolation at the pattern line due to the hinderside film formation.

BRIEF DESCRIPTION OF THE DRAWINGS

FIG. 2 is an enlarged sectional view taken along the line (A)—(A) in FIG. 1 with a substrate being placed thereon.

DETAILED DESCRIPTION

Figure 1:
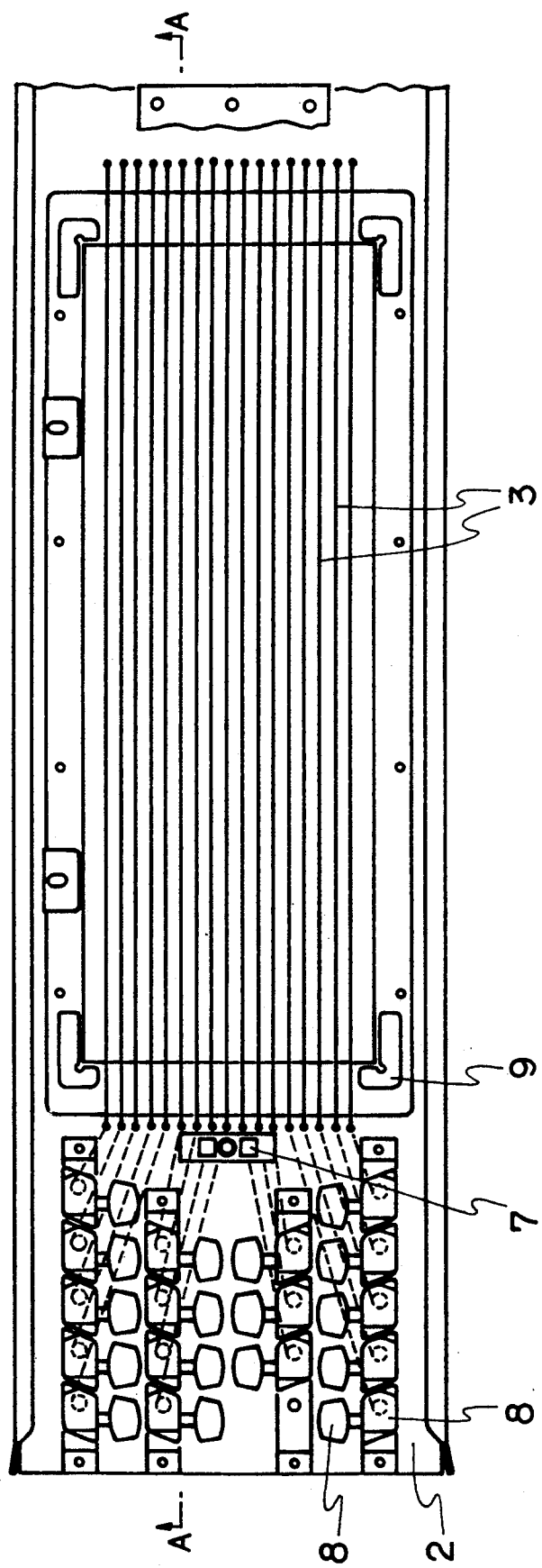
FIG. 1 is a plan view showing an embodiment of the film forming apparatus of the present invention without a substrate being placed thereon.

The film forming apparatus of the present invention is explained below.

Although there is explained an embodiment of the film forming apparatus of the present invention which is applied to plasma-CVD apparatus, the apparatus of the present invention can be applied to wide variety of apparatus used in the semiconductor production including other sputtering apparatus and evaporation apparatus, not only to plasma-CVD apparatus.

In FIGS. 1 and 2, the numeral 1 indicates a substrate made of glass, for example, having a transparent electrode on which a semiconductor layer and a backside electrode are to be formed. The transparent electrode of tin oxide or the like formed on the substrate are subjected to patterning by the laser-scribing method, the etching method or the like.

The numeral 2 indicates a holder (tray) which is attached to a plasma-CVD apparatus, and a plurality of wires 3 are stretched over the region of the holder 2 for holding the substrate 1. One end of each wire 3 is fixed to the holder 2, while the other end is attached to a tension control screw 8.

FIG. 2 illustrates a state wherein the substrate 1 is placed on the holder 2 which is applied to a plasma-CVD apparatus. The substrate is placed in such a manner that the film forming surface of the substrate 1 faces the wires 3, and fixed and positioned on the holder 2 by a fixing means comprising a backing plate 4, a spring 5, a pressing member 6 and a locking lever 7, thus the substrate 1 is pressed against the wires 3. This pressing is performed by utilizing the elastic force of the spring 5, thereby the wires 3 are maintained in substantially close contact with the film forming surface. By virtue of the substantially close contact of the wire 3 with the film forming surface, a pattern in which the transparent electrode is exposed can be obtained even in such an apparatus as plasma-CVD apparatus wherein the hinderside film formation is likely to occur.

One end of each wire 3 in the film forming apparatus of the present invention is attached to the tension control screw 8. The tension adjustment of the wires 3 can be performed by means of the tension control screws 8 before or after the substrate 1 is placed on the holder 2 in order to make sure of the substantially close contact of the wires 3 with the film forming surface.

The term "wire" or "wires" used in this specification includes a thread or threads of various material. A wire having smooth surface is preferably used in the present invention.

The wires 3 serve as a kind of mask, and the pattern line width can adequately adjusted by selecting the diameter of each wire 3 preferably within the range from 0.08 mm to 2.0 mm. The material of the wires 3 are not limited particularly and any material can be used as far as the used material can endure the film forming operation using the plasma-CVD method, the sputtering method or the like. For example, the piano wire class A or B (Japanese Industrial Standard G 3522) or nickel-titanium alloy wire can be used therefor.

In addition, there can be employed a construction wherein a weight is attached to the ends on one side of all the wire or some wires or to one end of each wire in order to maintain the tension of the wires 3 constantly, if the slack of the wires 3 due to heat in the film forming step becomes a problem. Further, the tension of the wires 3 can be maintained within a certain range by employing a tension control screw equipped with a spring.

Although there is explained above the application to a plasma-CVD apparatus, as mentioned previously film forming in a sputtering apparatus which is also a kind of glow discharge apparatus can be performed in the same manner. With regard to a vaporization apparatus, the hinderside film formation is less likely to occur and film formation can be performed successfully in the same manner.

There is explained next the semiconductor device producing method of the present invention.

A transparent electrode of tin oxide or the like is formed on a substrate of sheet glass or the like using the plasma-CVD method, the sputtering method, the vaporization method or the like, then the transparent electrode is subjected to patterning using the laser-scribing method or the like. Thereafter, the substrate having the patterned transparent electrode is fixed to the holder, on which the wires are stretched, in the previously mentioned film forming apparatus and an amorphous silicon semiconductor layer is formed thereon. The amorphous silicon semiconductor layer is formed under an ordinary condition in the order of, for example, p-layer, i-layer, n-layer using the plasma-CVD method or the like. With regard to the wire diameter for the wire mask, a diameter within a range from 0.08 mm to 2.0 mm is preferable and a diameter within a range from 0.1 mm to 0.5 mm is more preferable.

After the amorphous silicon semiconductor layer is formed, there is removed a defect in a pattern line formed by the wire mask, that is a very thin amorphous silicon semiconductor layer formed due to the hinderside film formation.

The amorphous silicon semiconductor layer may include not only Si element but also alloy containing other elements such as C, N, Sn and also may include microcrystal of those.

As a method for removing the thin film formed due to the hinderside film formation, there can be employed the wet etching method; the dry etching method such as the plasma etching method; the reverse sputtering method; or the like.

In case that the wet etching method is employed, an aqueous solution of KOH or NaOH is preferably used as the etching liquid and the removal of the thin film formed due to the hinderside film formation is carried out by dipping the whole substrate dismounted from the film forming apparatus into the above etching liquid. Thereafter, the whole substrate is cleaned with pure water and then dried. With regard to the concentration of an aqueous solution of KOH or NaOH used therein, a value within a range from 1 wt. % to 20 wt. % is preferable and a value within a range from 5 wt. % to 10 wt. % is especially preferable, because there can be prevented the excess removal of the amorphous silicon film other than the thin film formed due to the hinderside film formation and because there is provided an easy etching control by employing such a concentration. With regard to the liquid temperature of an aqueous solution of KOH or NaOH used, a value within a range from 10° C. to 40° C. is preferable and a value within a range from 20° C. to 30° C. is especially preferable, because there can be prevented the excess removal of the amorphous silicon film other than the thin film formed due to the hinderside film formation and because there is provided an easy etching control by employing such a temperature. With regard to the duration time of the etching, a period within a range from 10 seconds to 5 minutes is preferable and a period within a range from 30 seconds to 2 minutes is more preferable considering the accomplishment of the reliable removal of the thin film formed due to the hinderside film formation and the prevention of the excess removal of the amorphous silicon film other than the thin film formed due to the hinderside film formation.

After the film forming and the patterning of the amorphous silicon semiconductor layer is carried out in the above-described manner, the glass substrate having the transparent electrode and the amorphous silicon semiconductor layer is fixed to the holder, on which the wire mask is stretched, of the aforementioned film forming apparatus. Then a backside electrode is formed by sputtering of metal such as Al, Cr, Ag or the like. The above film formation may be performed using another method such as the plasma-CVD method or the evaporation method. The diameter of the wires used for the wire mask can be selected in the same manner as those in the patterning of the amorphous silicon semiconductor layer.

After the backside electrode is formed, there is removed a defect in a pattern line formed by the wire mask.

A thin film formed due to the hinderside film formation in the backside electrode can be removed in the similar manner to the film in the amorphous silicon semiconductor layer by employing the wet etching method; the dry etching method such as the plasma etching method; the reverse sputtering method; or the like.

In case that the wet etching method is employed, for example a liquid mixture of phosphoric acid, acetic acid, nitric acid and pure water can be used as the etching liquid if Al is used as the backside electrode. The removal of a defect in a pattern line, that is the aforementioned thin film formed due to the hinderside film formation, is carried out by dipping the whole substrate dismounted from the film forming apparatus into the above etching liquid. Thereafter, the whole substrate is cleaned with pure water and then dried. With regard to the volumetric mixing ratio in the above liquid mixture, an example ratio of phosphoric acid/acetic acid/nitric acid/pure water is 16/2/1/1. The above volumetric mixing ratio can be selected adequately in accordance with the thickness of the whole Al layer, the quantity of the film to be removed, the thickness thereof. For example, if the quantity of the film to be removed is small and the thickness thereof is thin, an etching liquid having the volumetric mixing ratio of 16/2/1/5 in the order of phosphoric acid, acetic acid, nitric acid and pure water is preferably used. The temperature of the liquid mixture can be selected in the same manner as that for the aforementioned patterning of the amorphous silicon semiconductor layer. With respect to the duration time of the etching, a period within a range from 10 seconds to 5 minutes is preferable and a period within a range from 30 seconds to 1 minute is more preferable considering the accomplishment of the reliable removal of the film formed due to the hinderside film formation and the prevention of the excess removal of the Al film other than the film to be removed. The etching liquid is not limited to the above liquid mixture, and for example diluted hydrochloric acid; aqueous solution of KOH; a liquid mixture of ferric chloride, concentrated hydrochloric acid and pure water; or the like can be preferably used.

If the backside electrode is made of Cr or Ag, the removal of a defect of the pattern line can be carried out in the same manner as that for Al backside electrode excepting that a different etching liquid from that for Al electrode may be used.

With respect to an etching liquid used for Cr electrode, an example liquid which can be used is a liquid mixture having a mixing ratio of perchloric acid in a range from 20 ml to 30 ml and pure water in a range from 300 ml to 1,000 ml per 100 g of ammonium cerium (IV) nitrate, and a preferable example mixing ratio is 26 ml of perchoric acid and 400 ml of pure water per 100 g of ammonium cerium (IV) nitrate.

With respect to an etching liquid used for Ag electrode, an example liquid which can be used is a liquid mixture having a mixing ratio of concentrated sulfuric acid in a range from 10 ml to 30 ml and pure water in a range from 1,000 ml to 5,000 ml per chromic acid anhydride in a range from 30 g to 50 g, and another example is aqueous solution of ferric nitrate in a range from 30 wt. % to 60 wt. %. In addition, a liquid mixture of aqueous ammonia and aqueous solution of hydrogen peroxide; or diluted nitric acid can be used as an etching liquid for Ag electrode. A preferable example is a mixture having a mixing ratio of 20 ml of concentrated sulfuric acid and 2,000 ml of pure water per 40 g of chromic acid anhydride and another preferable example is 55 wt. % aqueous solution of ferric nitrate.

Further, the method of the present invention can be applied to a backside electrode having a double-layer construction which is employed in order to prevent constituent metal of a backside electrode from diffusing into an amorphous silicon semiconductor layer. For example, if a backside electrode is Cr (20 Å to 100 Å)/Al(1,000 Å to 10,000 Å), a defect can be removed only by the etching of Al layer because Cr layer on the amorphous silicon semiconductor side is very thin and the hinderside film formation is not likely to occur. For this purpose, there can be used an etching liquid which is selected from a group consisting of liquid mixture of phosphoric acid, acetic acid, nitric acid and pure water; diluted hydrochloric acid; aqueous solution of KOH; liquid mixture of ferric chloride, concentrated hydrochloric acid and pure water; liquid mixture of ammonium cerium (IV) nitrate, perchloric acid and pure water; diluted hydrochloric acid; and diluted sulfuric acid.

A defect in a backside electrode of Ag (20 Å to 100 Å)/Al (1,000 Å to 10,000 Å) can also be removed only by the etching of Al layer. For this purpose, there can be used an etching liquid which is selected from a group consisting of liquid mixture of phosphoric acid, acetic acid, nitric acid and pure water; diluted hydrochloric acid; aqueous solution of KOH; liquid mixture of ferric chloride, concentrated hydrochloric acid and pure water; liquid mixture of chromic acid anhydride, concentrated sulfuric acid and pure water; aqueous solution of ferric nitrate; liquid mixture of aqueous ammonia and aqueous solution of hydrogen peroxide; and diluted nitric acid.

Also, the method of the present invention can be applied to any other metal electrode for the removal of a defect of a pattern line.

Although in the foregoing description a step of removing a film formed due to the hinderside film formation is conducted in producing both an amorphous silicon semiconductor layer and backside electrode, the method of the present invention is characterised by including a removing step in the film forming of at least one of the amorphous silicon semiconductor layer and a backside electrode. Therefore, the patterning operation can be carried out for one layer in accordance with the method of the present invention and for another layer in accordance with other method.

Embodiments are explained next wherein the film forming is performed using the film forming apparatus of the present invention and simultaneously the patterning is completed in accordance with the producing method of the present invention. However, it is a matter of course that the present invention is not limited to the embodiments.

EXAMPLE 1

A transparent electrode of tin oxide having the thickness of 6,000 Å was formed on a soda lime sheet glass having the thickness of 2.0 mm and the size of 150 mm×400 mm, and the segregation of the transparent electrode into a specified pattern was performed using laser beam. A substrate 1 patterned in the above manner was fixed to a holder 2 illustrated in FIG. 1. The substrate 1 was positioned with the assistance of four guide members 9. The total number of the wires 3 was 17 and the piano wire class B having a diameter of 0.3 mm was used. The tension of each wire 3 had been adjusted by a tension control screw 8 before the substrate 1 was fixed to the holder 2. FIG. 2 illustrates a state in which the substrate 1 is fixed to the holder 2.

The holder 2 with the substrate 1 having been fixed thereto was placed in an plasma-CVD apparatus. A 150 Å thick p-type amorphous silicon carbide was formed at the substrate temperature of 130° C. and the pressure of 0.1 Torr, a 6,000 Å thick i-type amorphous silicon was formed at the substrate temperature of 180° C. and the pressure of 0.5 Torr, and a 300 Å thick n-type microcrystalline silicon was formed at the substrate temperature of 180° C. and the pressure of 1.0 Torr. Thereafter the holder was removed from the apparatus and the substrate was dismounted from the holder for the inspection of the region where the substrate had been masked by the wires. In the above inspection of the 17 pattern lines segregating the semiconductor layer, the hinderside film formations were observed a little.

Thereafter, the substrate with the amorphous silicon layer having been formed thereon was dipped into a 10 wt % aqueous solution of KOH for 30 seconds at the liquid temperature of 20° C. for the etching of the film formed due to the hinderside film formation. The region where the substrate had been masked by the wires were inspected again but no hinderside film formation was observed. In addition, it was also inspected that the thickness of the amorphous silicon layer other than the masked region was not reduced by the etching. For the region where the transparent electrode was completely exposed, the minimum pattern width of each pattern line was measured one by one and as a result the average of the minimum pattern widths of the above 17 lines was 165 μm. The result of each measurement is shown in Table 1.

Further, the distance between the edge of the pattern line of the transparent electrode and the nearer edge of the segregation line of the semiconductor layer was about 150 μm.

TABLE 1

| | Segregation line location | | | | | | | | | | | | | | | | |
|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 |
| Minimum pattern width (μm) | 170 | 150 | 130 | 180 | 160 | 190 | 200 | 140 | 200 | 180 | 160 | 150 | 170 | 170 | 160 | 130 | 160 |

The substrate having the segregated semiconductor layer obtained in the aforementioned manner was fixed to a holder of the same type as that shown in FIG. 1 in such a manner that the semiconductor surface faced wires. In the holder, each of 17 wires was arranged being displaced by 0.25 mm from the location of the corresponding wire in FIG. 1 in the perpendicular direction relative to the wire. The wire diameter of 0.2 mm was employed. In addition, the tension of each wire had been adjusted by a tension control screw before the substrate was fixed to the holder.

Then, the holder with the substrate having been fixed thereto was placed in an magnetron sputtering apparatus. A 5,000 Å thick Al layer was formed at the substrate temperature of 80° C. with the argon pressure being controlled at 6×10$^{-3}$ Torr. Thereafter the substrate was dismounted and the segregation lines in the Al backside electrode were subjected to measurement in the aforementioned manner. For the region where the semiconductor layer was completely exposed as a result of the masking in Al formation, the minimum pattern width of each segregation line measured one by one is shown in Table 2.

TABLE 2

| | Segregation line location | | | | | | | | | | | | | | | | |
|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 |
| Minimum pattern width (μm) | 120 | 90 | 110 | 100 | 90 | 100 | 100 | 120 | 130 | 110 | 130 | 130 | 120 | 100 | 140 | 130 | 130 |

As shown in Table 2, no region was observed where the segregation of the backside electrode was insufficient, and successful result was obtained. The characteristics of the solar cell obtained in the aforementioned manner were measured by a pulse simulator of AM-1.5 approximation type. The result of the measurement is shown in Table 3.

COMPARATIVE EXAMPLE 1

A substrate having a transparent electrode patterned in the same manner as that in Example 1 was fixed to a holder same as that in FIG. 1, excepting that the holder used had no wires of fine threads, to form a semiconductor layer on almost whole surface under the same condition as that in Example 1. The segregation of the semiconductor layer was performed employing YAG laser. Also with respect to the sputtering of Al backside electrode, the backside electrode was formed on almost whole surface under the same condition as that in Example 1 without using the wires of fine threads, and thereafter the segregation of the Al layer was performed by means of the chemical etching method.

The characteristics of the obtained solar cell were measured in the same manner as employed in Example 1. The result of the measurement is shown in Table 3. Isc, Voc and FF respectively represent short circuit current, open circuit voltage and fill factor.

TABLE 3

|  | Isc (mA) | Voc (V) | FF (%) | Maximum output (Wp) |
|---|---|---|---|---|
| Example 1 | 410 | 16.1 | 63 | 4.16 |
| Comparative Example 1 | 400 | 16.0 | 60 | 3.84 |

EXAMPLE 2

A transparent electrode of tin oxide was formed on a soda lime sheet glass, and thereon silicon layers of p-type and n-type were formed and the substrate having the semiconductor layer was fixed to a film having apparatus for the subsequent forming of a backside electrode. These operations were conducted in the same manner as employed in Example 1.

Then, the holder with the substrate having been fixed thereto was placed in an magnetron sputtering apparatus. A 50 Å thick Cr layer was formed at the substrate temperature of 80° C. with the argon pressure being controlled at $1 \times 10^{-3}$ Torr and a 5000 Å thick Al layer was formed at the substrate temperature of 80° C. and the argon pressure of $6 \times 10^{-3}$ Torr. Thereafter, the substrate was dismounted from the holder for the inspection of the region in the Cr/Al backside electrode where the masking had been located, and the hinderside film formation was observed in several parts and some conductive connections were formed. Therefore, the substrate with Cr/Al layer having been formed thereon was dipped into an etching solution comprising 400 ml of phosphoric acid, 50 ml of acetic acid, 25 ml of nitric acid and 25 ml of pure water for the etching of the film formed due to the hinderside film formation. The dipping was conducted for 30 seconds at the liquid temperature of 20° C. Then the region where the masking had been located was inspected but no hinderside film formation or no conductive connection was observed. The segregation line of the Cr/Al backside electrode was subjected to the same measurement as in Example 1 with regard to the region where the masking had been located and the semiconductor layer was completely exposed, and the average of the minimum pattern widths of 17 lines was 180 μm. With respect to the Al layer other than the masked region, measured reduction of the thickness thereof was from 100 Å to 200 Å and such thickness reduction was within an allowable range which would not impair the performance of the semiconductor device.

The characteristics of the solar cell obtained in the aforementioned manner were measured by a pulse simulator of AM-1.5 approximation type. The result of the measurement is shown in Table 4.

COMPARATIVE EXAMPLE 2

A substrate having a transparent electrode patterned in the same manner as that in Example 2 was fixed to a holder same as that in FIG. 1, excepting that the holder used had no wires of fine threads, to form a semiconductor layer on almost whole surface under the same condition as that in Example 2. The segregation of the semiconductor layer was performed employing YAG laser. Also with respect to the sputtering of Cr or Al for the backside electrode, the backside electrode was formed on almost whole surface under the same condition as that in Example 2 without using the wires of fine threads, and thereafter the segregation of the Cr or Al layer was performed by means of the chemical etching method.

The characteristics of the obtained solar cell were measured in the same manner as employed in Example 2. The result of the measurement is shown in Table 4.

TABLE 4

|  | Isc (mA) | Voc (V) | FF (%) | Maximum output (Wp) |
|---|---|---|---|---|
| Example 2 | 405 | 16.2 | 64 | 4.21 |
| Comparative Example 2 | 402 | 16.1 | 60 | 3.88 |

It can be understood from Table 4 that a solar cell prepared in accordance with the present invention has characteristics equal to or higher than a prior art solar cell.

As explained hereinbefore, film forming of a semiconductor layer or the like using the film forming apparatus of the present invention eliminates a need for a separate patterning operation using laser or the like, and accordingly there can be prevented any deterioration of solar cell properties. Also, the film forming step and the patterning step can be performed simultaneously, and therefore there can be eliminated a need for complex steps such as the resist applying, the resist curing, the resist removing and the like employed in the usual etching method. Thus, there is provided an advantageous effect that the production cost of a solar cell can be reduced steeply.

Further the producing method of a semiconductor device of the present invention enables a very thin film formed due to the hinderside film formation to be removed in a reliable manner. Therefore, complete patterning is achieved and the yield of the product is improved. Moreover, since there is no need of strict control for the wire position, the operation can be carried out easily.

What is claimed is:

1. A method for producing a semiconductor device wherein a patterned transparent electrode, a patterned amorphous silicon semiconductor layer and a patterned backside electrode are formed on a substrate sequentially in this order, characterized in that the patterning of at least one of the amorphos silicon semiconductor layer and the backside electrode is carried out in a step of forming at least one of the amorphous silicon semiconductor layer and the backside electrode with a wire mask having a plurality of non-intersecting wires, each of said wires having a diameter of 0.08 mm to 2.0 mm and, each of said wires being brought into substantially close contact with a surface subjected to film forming and step of removing a thin film formed at a region between the wire mask and the surface subjected to film forming in the forming step by non-selectively reducing the thickness of the formed layer.

2. The method of claim 1, wherein means employed in the removing step is etching.

3. The method of claim 2, wherein the etching is wet etching.

4. The method of claim 3, wherein an etching liquid used in the etching of the amorphous silicon semiconductor layer is an aqueous solution of KOH or NaOH.

5. The method of claim 3, wherein the backside electrode is made of Al and an etching liquid is selected from a group consisting of liquid mixture of phosphoric acid, acetic acid, nitric acid and pure water; diluted hydrochloric acid; aqueous solution of KOH; and liquid mixture of ferric chloride, concentrated hydrochloric acid and pure water.

6. The method of claim 3, wherein the backside electrode is made of Cr and an etching liquid is liquid mixture of ammonium cerium (IV) nitrate, perchloric acid and pure water.

7. The method of claim 3, wherein the backside electrode is made of Ag and an etching liquid is selected from a group consisting of liquid mixture of chromic acid anhydride, concentrated sulfuric acid and pure water; aqueous solution of ferric nitrate; liquid mixture of aqueous ammonia and aqueous solution of hydrogen peroxide; and diluted nitric acid.

8. The method of claim 3, wherein the backside electrode has a double-layer construction of Cr and Al and an etching liquid is selected from a group consisting of liquid mixture of phosphoric acid, acetic acid, nitric acid and pure water; diluted hydrochloric acid; aqueous solution of KOH; liquid mixture of ferric chloride, concentrated hydrochloric acid and pure water; liquid mixture of ammonium cerium (IV) nitrate, perchloric acid and pure water; diluted hydrochloric acid; and diluted sulfuric acid.

9. The method of claim 3, wherein the backside electrode has a double-layer construction of Ag and Al and an etching liquid is selected from a group consisting of liquid mixture of phosphoric acid, acetic acid, nitric acid and pure water; diluted hydrochloric acid; aqueous solution of KOH; liquid mixture of ferric chloride, concentrated hydrochloric acid and pure water; liquid mixture of chromic acid anhydride, concentrated sulfuric acid and pure water; aqueous solution of ferric nitrate; liquid mixture of aqueous ammonia and aqueous solution of hydrogen peroxide; and diluted nitric acid.

10. The method of claim 2, wherein the etching is dry etching.

11. The method of claim 10, wherein the dry etching is plasma etching.

12. The method of claim 1, wherein means employed in the removing step is reverse sputtering.

* * * * *